(12) United States Patent
Ohnishi et al.

(10) Patent No.: US 8,456,024 B2
(45) Date of Patent: *Jun. 4, 2013

(54) SEMICONDUCTOR DEVICE HAVING A PAD-DISPOSITION RESTRICTION AREA

(75) Inventors: Manabu Ohnishi, Osaka (JP); Koji Takemura, Osaka (JP); Noriyuki Nagai, Nara (JP); Hoyeun Huh, Kyoto (JP); Tomoyuki Nakayama, Osaka (JP); Atsushi Doi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/489,215

(22) Filed: Jun. 5, 2012

(65) Prior Publication Data

US 2012/0241970 A1 Sep. 27, 2012

Related U.S. Application Data

(62) Division of application No. 12/913,308, filed on Oct. 27, 2010, now Pat. No. 8,212,366.

(30) Foreign Application Priority Data

Mar. 27, 2003 (JP) .................................. 2003-087824

(51) Int. Cl.
*H01L 23/52* (2006.01)
(52) U.S. Cl.
USPC ........................................................ 257/784
(58) Field of Classification Search
USPC .................... 257/784, 786, 773, 778, E23.02, 257/E23.048
See application file for complete search history.

(56) References Cited

U.S. PATENT DOCUMENTS

| | | | |
|---|---|---|---|
| 5,581,109 A | 12/1996 | Hayashi et al. |
| 5,671,234 A | 9/1997 | Phillips et al. |
| 5,892,276 A | 4/1999 | Miki et al. |
| 5,929,650 A | 7/1999 | Pappert et al. |
| 6,008,542 A | 12/1999 | Takamori |
| 6,130,484 A | 10/2000 | Kameda et al. |
| 6,204,087 B1 | 3/2001 | Parker et al. |

(Continued)

FOREIGN PATENT DOCUMENTS

| | | | |
|---|---|---|---|
| JP | 6-53413 A | 2/1994 |
| JP | 8-236585 A | 9/1996 |

(Continued)

OTHER PUBLICATIONS

U.S. Notice of Allowance issued in U.S. Appl. No. 10/809,910, mailed on Jan. 20, 2006.

(Continued)

*Primary Examiner* — Nathan Ha
(74) *Attorney, Agent, or Firm* — McDermott Will & Emery LLP

(57) ABSTRACT

Input/output cells are formed so as to be peripherally arranged adjacent to a corner cell on a surface of a semiconductor chip, and electrode pads are formed on the respective input/output cells. The electrode pads are configured in a zigzag pad arrangement so as to form inner and outer pad arrays. However, of the electrode pads forming the inner pad array, those electrode pads in predetermined areas adjacent to the two sides of the corner cell are not disposed, such that an interconnect pattern of a carrier which is bump-bonded to the semiconductor chip and vias are prevented from becoming complex.

9 Claims, 8 Drawing Sheets

U.S. PATENT DOCUMENTS

| | | |
|---|---|---|
| 6,310,402 B1 | 10/2001 | Watanabe et al. |
| 6,410,989 B1 | 6/2002 | Shivkumar et al. |
| 6,707,164 B2 | 3/2004 | Cheng et al. |
| 6,836,026 B1 | 12/2004 | Ail et al. |
| 6,924,552 B2 | 8/2005 | Baukus et al. |
| 6,956,283 B1 | 10/2005 | Peterson |
| 7,005,720 B2 | 2/2006 | Huang et al. |
| 7,274,094 B2 | 9/2007 | Boon et al. |
| 7,291,909 B2 * | 11/2007 | Yamamura .................... 257/691 |
| 7,307,352 B2 * | 12/2007 | Choi ............................. 257/786 |
| 2003/0000737 A1 | 1/2003 | Liu et al. |
| 2003/0218240 A1 | 11/2003 | Cho |
| 2003/0230792 A1 | 12/2003 | Wu et al. |

FOREIGN PATENT DOCUMENTS

| | | |
|---|---|---|
| JP | 2000-12698 A | 1/2000 |
| JP | 2000-164620 A | 6/2000 |
| JP | 2002-252246 A | 9/2002 |
| JP | 2002-319607 A | 10/2002 |
| JP | 2003-060051 | 2/2003 |

OTHER PUBLICATIONS

U.S. Notice of Allowance issued in U.S. Appl. No. 11/374,057, mailed on May 14, 2008.

U.S. Notice of Allowance issued in U.S. Appl. No. 12/213,410, mailed on Oct. 19, 2009.

U.S. Notice of Allowance issued in U.S. Appl. No. 12/688,506, mailed on Jul. 27, 2010.

U.S. Notice of Allowance issued in U.S. Appl. No. 12/913,308, mailed on Mar. 5, 2012.

Japanese Office Action issued in corresponding Japanese Patent Application No. JP 2003-087824, dated Jan. 4, 2007.

* cited by examiner

SEMICONDUCTOR DEVICE HAVING A PAD-DISPOSITION RESTRICTION AREA

This application is a Divisional of U.S. application Ser. No. 12/913,308, filed on Oct. 27, 2010, which is now U.S. Pat. No. 8,212,366, which is a Divisional of U.S. application Ser. No. 12/688,506, filed on Jan. 15, 2010, which is now U.S. Pat. No. 7,847,418, which is a Divisional of U.S. application Ser. No. 12/213,410, filed on Jun. 19, 2008, which is now U.S. Pat. No. 7,675,184, which is a Divisional of U.S. application Ser. No. 11/374,057, filed on Mar. 14, 2006, which is now U.S. Pat. No. 7,397,138, which is a Divisional of U.S. application Ser. No. 10/809,910, filed on Mar. 26, 2004, which is now U.S. Pat. No. 7,030,503, and claims priority of Japanese Patent Application No. 2003-087824, filed on Mar. 27, 2003, the entire contents of each of which are hereby incorporated by reference.

BACKGROUND OF THE INVENTION

The present invention relates to CSP (chip size package) semiconductor devices. Techniques have been known in which in a semiconductor device, a plurality of electrode pads, each having a tenon-like conformation in plan view, are configured in a zigzag pad arrangement so as to form inner and outer pad arrays. Each of the electrode pads has a narrow, probing portion for testing or analyzing, and a wide, bonding portion which is wire-bonded to a package terminal. By this structure, the pad pitch is reduced, while the influence of probe marks is lessened (see Japanese Laid-Open Publication No. 2000-164620.)

CSP semiconductor devices were developed to reduce package size. Examples of the CSP semiconductor devices include a semiconductor device formed by flip-chip (face-down) bonding a semiconductor chip to a carrier which is used for external connection with the semiconductor chip. If concentrated stress applied to the bottom-face corners of the semiconductor chip during testing is taken into account, formation of circuit elements is restricted so that no circuit elements are formed in predetermined regions near the corners on the semiconductor chip surface (see Japanese Laid-Open Publication No. 2002-252246.)

A POE (pad on element) technique may be employed for CSP semiconductor devices. By a POE technique, electrode pads are formed on input/output cells that include circuit elements formed so as to be peripherally arranged on the semiconductor chip surface. This structure allows the semiconductor chip to be decreased in size.

Nevertheless, if a zigzag electrode-pad arrangement is also adopted, a reduced pad pitch creates difficulties in designing a CSP carrier that can accommodate regions near the corners on the semiconductor chip surface. More specifically, of the interconnect patterns formed on the carrier surface, those patterns that are bump-bonded to the inner pad arrays of the semiconductor chip, and vias in the carrier become complex, such that so-called "via generation" cannot be performed from the inner pad arrays near the corners. This causes an increase in the size of the semiconductor chip.

SUMMARY OF THE INVENTION

It is therefore an object of the present invention to eliminate any cause of an increase in the size of a semiconductor chip in a CSP semiconductor device in which a POE technique and a zigzag electrode-pad arrangement are employed.

In order to achieve this object, in the present invention, a predetermined area near a corner on a semiconductor chip surface is designated as a pad-disposition restriction area, within which disposing and usage of electrode pads that are bump-bonded to an interconnect pattern formed on a carrier surface are restricted.

DESCRIPTION OF THE PREFERRED EMBODIMENTS

Hereinafter, an embodiment of the present invention will be described in detail with reference to the accompanying drawings.

Figure 1:
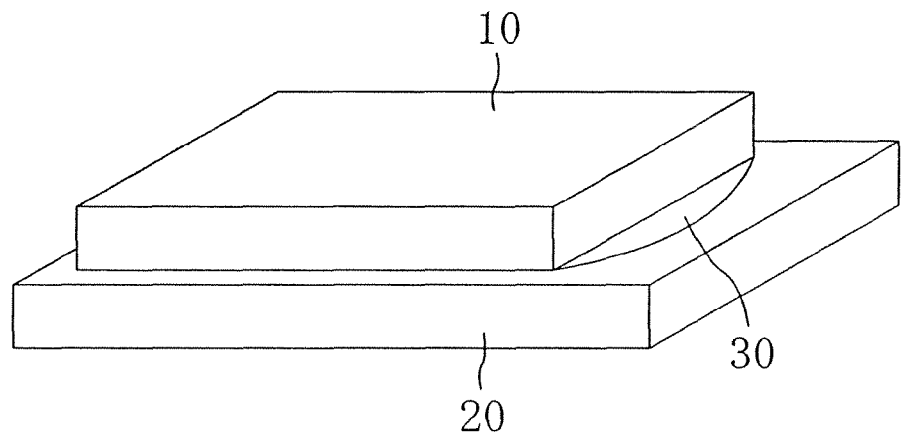
FIG. 1 is a perspective view illustrating an example of the entire structure of a semiconductor device in accordance with the present invention.

FIG. 1 is a perspective view illustrating an example of the entire structure of a semiconductor device in accordance with the present invention. The semiconductor device of FIG. 1 is a CSP semiconductor device formed by flip-chip bonding a semiconductor chip 10 to a carrier 20 which is used for external connection with the semiconductor chip 10. Gaps between the semiconductor chip 10 and the carrier 20 are sealed with a sealing resin 30. Electrode pads formed on the surface of the semiconductor chip 10 are flip-chip bonded to interconnect patterns formed on the surface of the carrier 20, by bumps (Au bumps, for example) formed on the electrode pads of the semiconductor chip 10. A cap may be placed to cover and seal the semiconductor chip 10.

Figure 2:
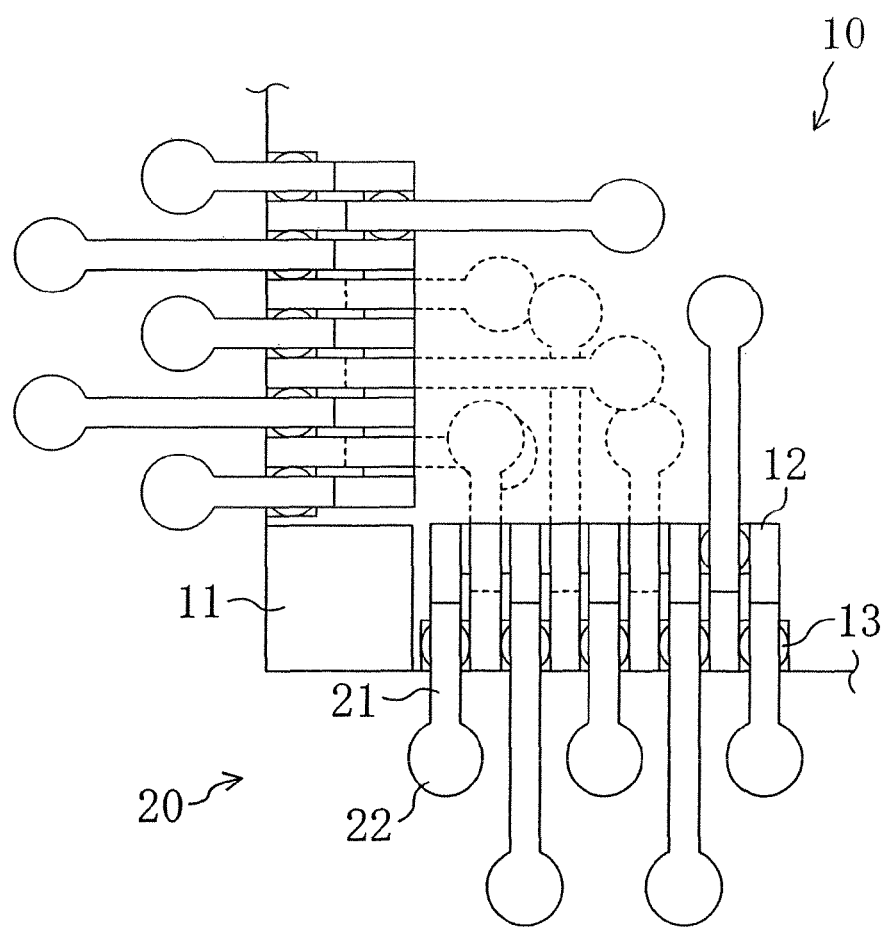
FIG. 2 is a plan view illustrating a corner of the electrode-pad formation surface of a semiconductor chip shown in FIG. 1 as well as an interconnect pattern on a carrier surface and the location of vias in the carrier.

FIG. 2 is a plan view illustrating a corner of the electrode-pad formation surface of the semiconductor chip 10 shown in FIG. 1. On the semiconductor chip 10 surface, various kinds of integrated circuit elements are formed in the central area, while a corner cell 11 is formed in a corner, input/output cells 12 are formed so as to be arranged in the periphery, and electrode pads 13 are formed on the respective input/output cells 12. The input/output cells 12 include circuit elements for signal input/output. On the circuit elements, the plurality of electrode pads 13 are formed by a POE technique. Those electrode pads 13 are configured in a zigzag pad arrangement so as to form inner and outer pad arrays.

The carrier 20 is made of ceramic, for example. The carrier 20 has, on its surface, an interconnect pattern 21 that is to be bump-bonded to the electrode pads 13 of the semiconductor chip 10, while having, on its bottom, external terminals (not shown) of the semiconductor device. The interconnect pattern 21 is internally connected to the external terminals through vias 22 in the thickness direction. The carrier 20 is also called a substrate or an interposer. An interconnect pattern inside the carrier 20 may be a multilayer interconnect.

Figure 3:
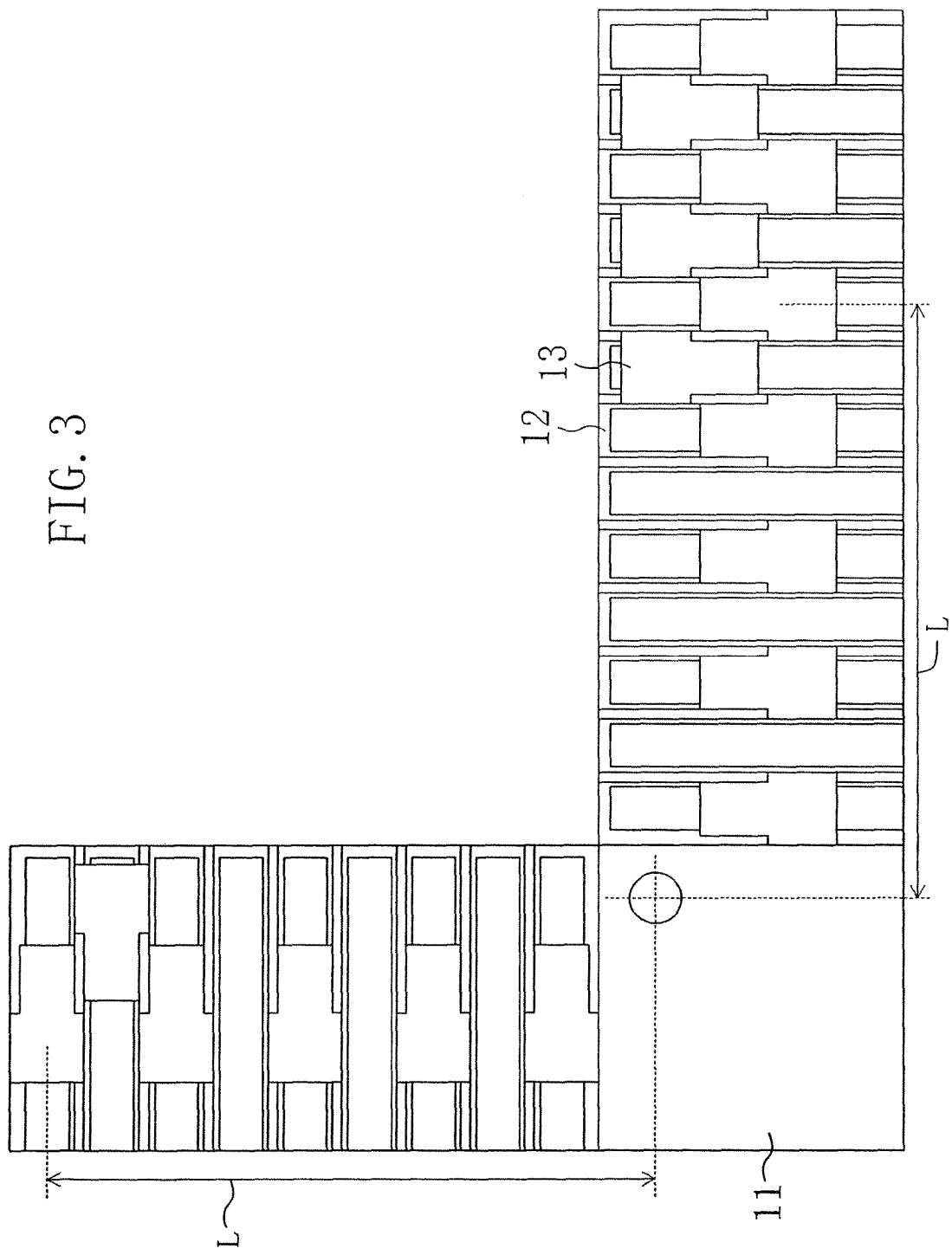
FIG. 3 is a magnified plan view illustrating an electrode-pad arrangement on the semiconductor chip of FIG. 2.

FIG. 3 is a magnified plan view illustrating the arrangement of the electrode pads 13 shown in FIG. 2. As shown in FIGS. 2 and 3, of the electrode pads 13 forming the inner pad arrays, a total of six electrode pads located adjacent to the two sides of the corner cell 11 is not disposed. Therefore, the interconnect pattern 21 of the carrier 20 and the vias 22 can be prevented from becoming complex as indicated by broken lines in FIG. 2.

To make a more detailed explanation with reference to FIG. 3, each electrode pad 13, which has a tenon-like conformation in plan view, includes a narrow, probing portion for testing or analyzing, and a wide, bonding portion which is bump-bonded to the interconnect pattern 21 on the surface of the carrier 20. In this embodiment, if the pitch of the input/output cells 12 and the pitch of the zigzag electrode pads 13 are 60 μm, a dimension L of pad-disposition restriction areas, which is measured from an intersection point of the center lines of the wide bonding portions in the inner pad arrays, is 508.4 μm. The dimension L is determined in accordance with design rules (for example, the width of the interconnect pattern 21 and the size of the vias 22) for the carrier 20. In the pad-disposition restriction areas, some (six in total) of the electrode pads 13 that form the inner pad arrays are not formed. Therefore, the pad pitch in the pad-disposition restriction areas is 120 μm, which is twice the pad pitch (60 μm) in the other area. The size of the corner cell 11 is 295 μm×295 μm, for example.

Hereinafter, first through sixth modified examples of the electrode-pad arrangement of FIG. 3 will be described. Those modified examples produce other effects in addition to the above effects that complication of the interconnect pattern 21 of the carrier 20 and of the vias 22 are prevented, and that any cause of an increase in the semiconductor chip 10 size is eliminated.

Figure 4:
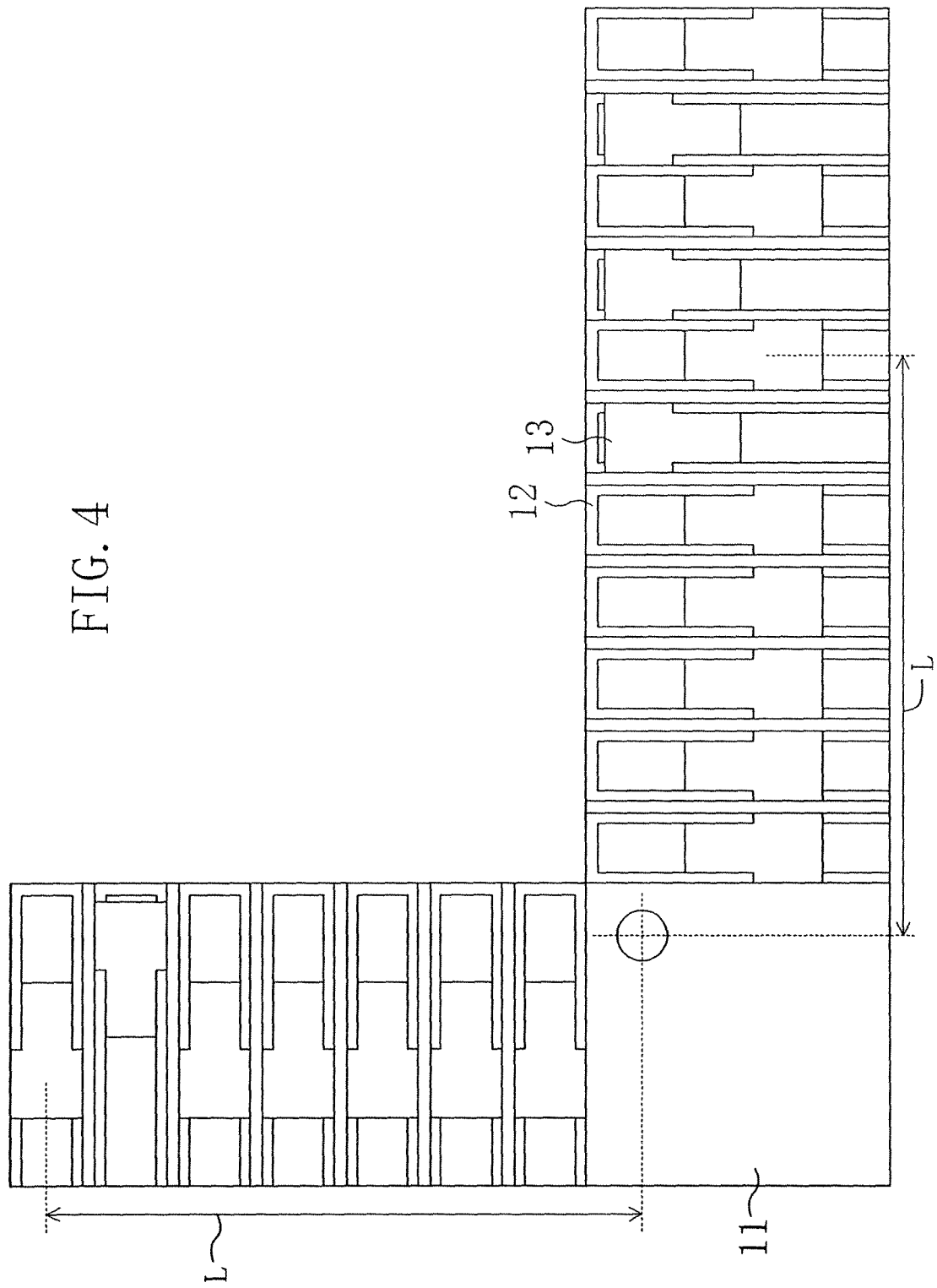
FIG. 4 is a plan view illustrating a first modified example of the electrode-pad arrangement of FIG. 3.

FIG. 4 illustrates a first modified example of the electrode-pad arrangement of FIG. 3. In FIG. 4, the pitch of the outer pad arrays in the pad-disposition restriction areas is reduced according to the minimum separation rules regarding disposition of the input/output cells 12. As a result, in the outer electrode-pad arrays adjacent to the two sides of the corner cell 11, two electrode pads 13 in total can be added as compared with the case of FIG. 3.

Figure 5:
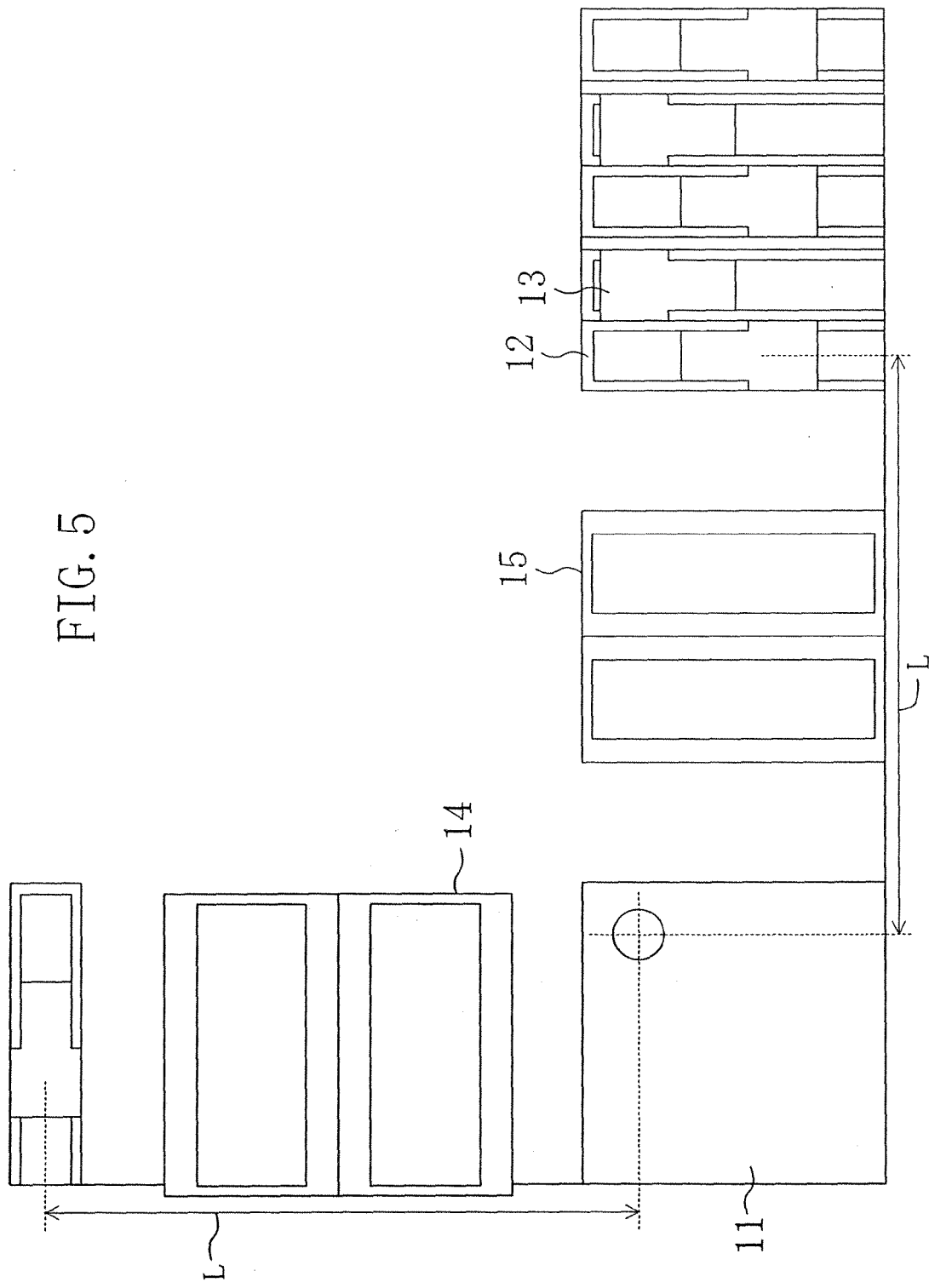
FIG. 5 is a plan view illustrating a second modified example of the electrode-pad arrangement of FIG. 3.

FIG. 5 illustrates a second modified example of the electrode-pad arrangement. In FIG. 5, no inner and outer pad arrays are formed in the pad-disposition restriction areas, and instead of the input/output cells associated with those arrays, other kinds of function cells, such as ESD (electro-static discharge) protection cells 14 and power-source isolation cells 15 for preventing power interference between analog and digital circuits, are disposed. This enables a further reduction in area.

In third through sixth modified examples, which will be discussed next, inner and outer pad arrays are also formed in the pad-disposition restriction areas with substantially the same pitch as that in the other area. In other words, the inner and outer pad arrays are both formed reaching close to the corner cell 11.

Figure 6:
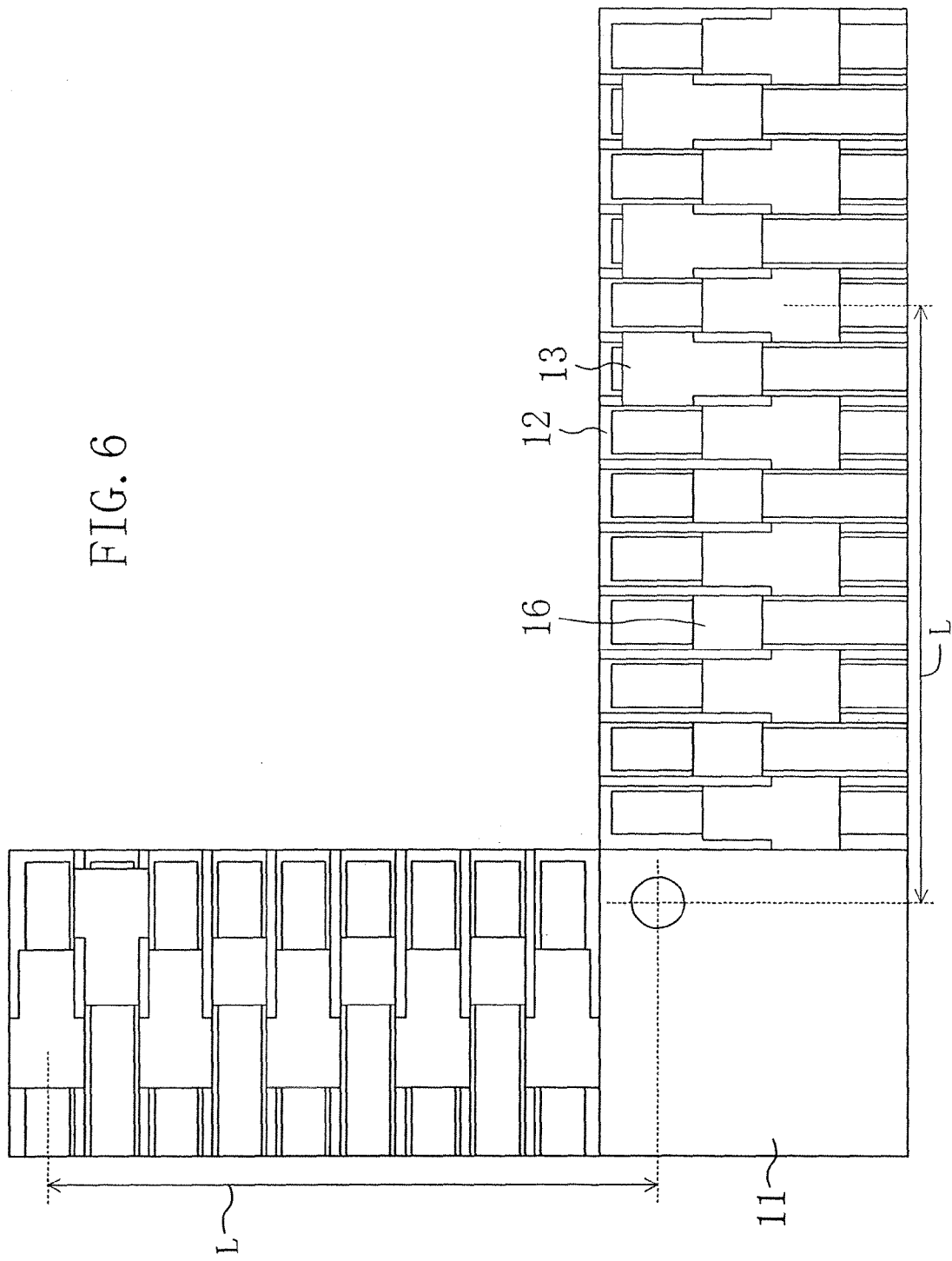
FIG. 6 is a plan view illustrating a third modified example of the electrode-pad arrangement of FIG. 3.

FIG. 6 illustrates a third modified example of the electrode-pad arrangement. In FIG. 6, probing-specific pads 16 used for testing or analyzing are provided in the electrode-pad-disposition omission positions of FIG. 3. Those probing-specific pads 16 each include only a narrow probing portion, and are not bump-bonded to the interconnect pattern 21 of the carrier 20. This results in an increase in the observability and controllability of the semiconductor device during probing. It should be noted that like the other electrode pads 13, the probing-specific pads 16 may have a tenon-like conformation in plan view, but their wide bonding portions are not used.

Figure 7:
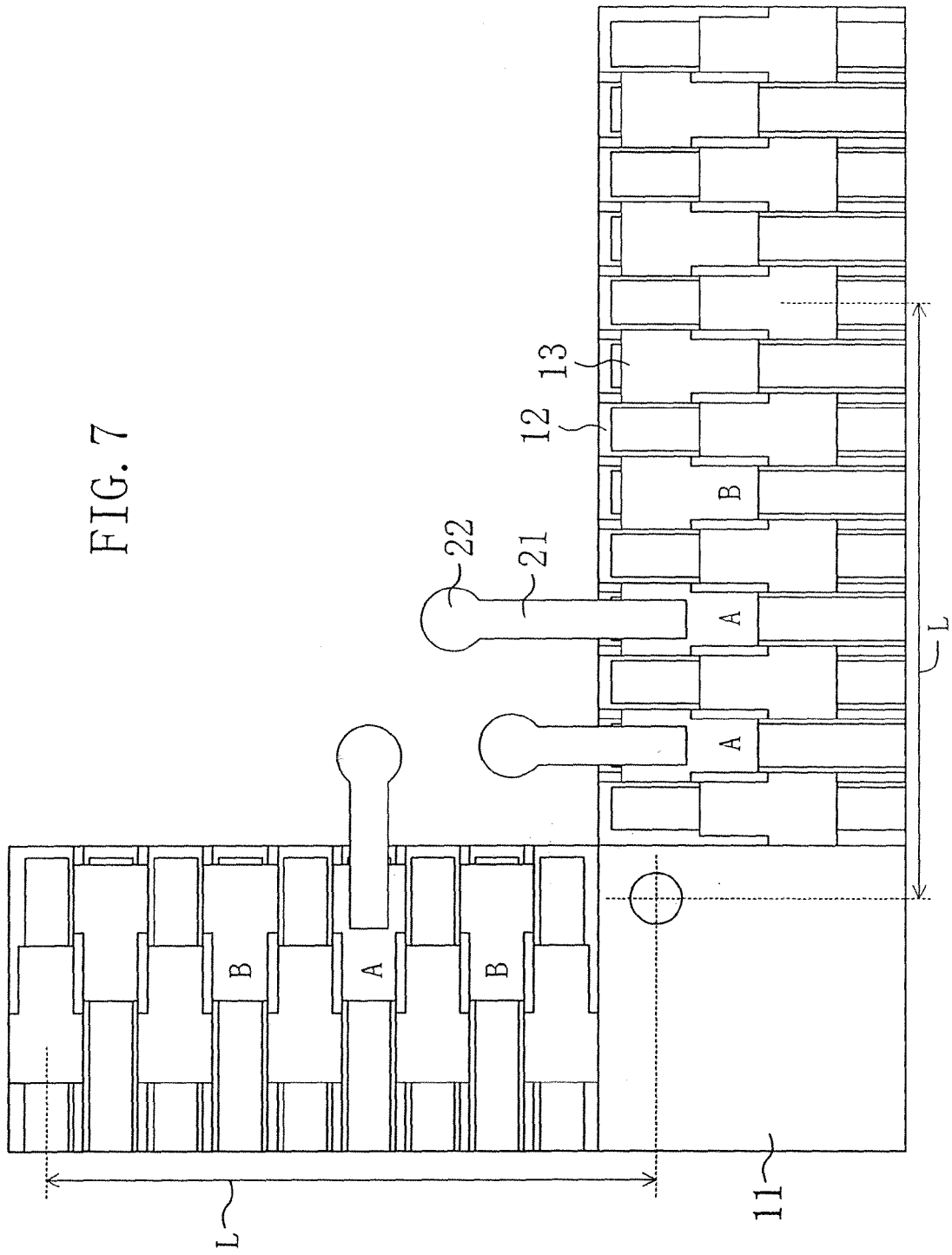
FIG. 7 is a plan view illustrating a fourth modified example of the electrode-pad arrangement of FIG. 3.

FIG. 7 illustrates a fourth modified example of the electrode-pad arrangement. In FIG. 7, only some electrode pads 13 (three electrode pads designated by "A" in the example shown in FIG. 7) in the inner pad arrays that correspond to the electrode-pad-disposition omission positions of FIG. 3 are individually bump-bonded to the interconnect pattern 21 on the carrier 20 surface. The remaining electrode pads 13 (three electrode pads designated by "B" in the example shown in FIG. 7) are not connected to the interconnect pattern 21 of the carrier 20. However, for those remaining electrode pads 13, via generation for establishing connection with the carrier 20 is performed individually (illustration thereof is omitted.)

In the example of FIG. 7, by changing the locations of the interconnect pattern 21 of the carrier and the vias 22, only the three electrode pads 13 designated by "B" in FIG. 7, in the inner pad arrays that correspond to the electrode-pad-disposition omission positions of FIG. 3 can be individually bump-bonded to the interconnect pattern 21 of the carrier 20. Therefore, preparing various kinds of carriers 20 for identical semiconductor chips 10 facilitates the development of product variation in the semiconductor devices.

Figure 8:
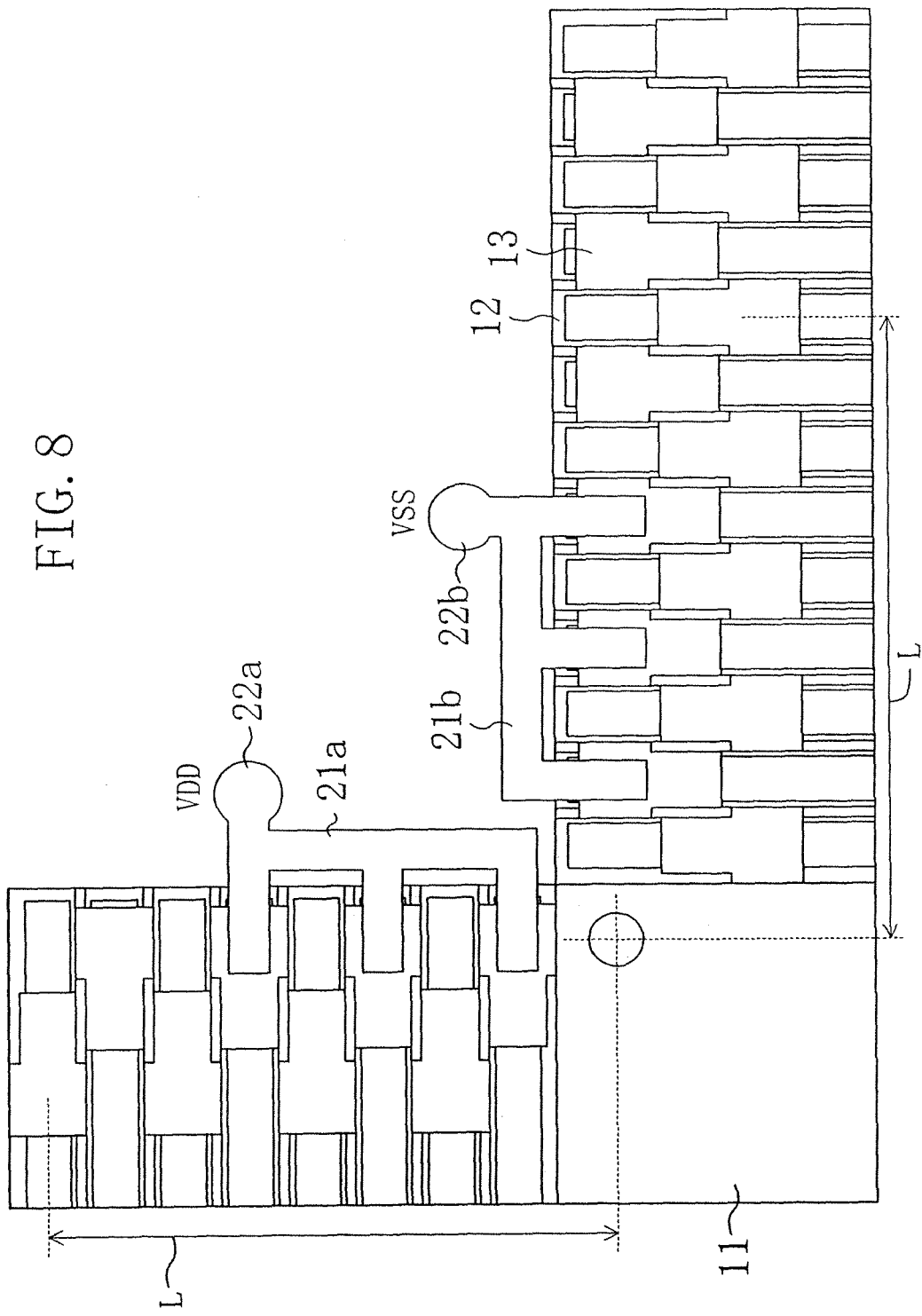
FIG. 8 is a plan view illustrating a fifth modified example of the electrode-pad arrangement of FIG. 3.

FIG. 8 illustrates a fifth modified example of the electrode-pad arrangement. In FIG. 8, electrode pads 13 (three electrode pads located in an upper potion of the corner cell 11 in FIG. 8) that form one of the inner pad arrays corresponding to the electrode-pad-disposition omission positions of FIG. 3 are individually bump-bonded to an interconnect pattern on the surface of the carrier 20. Those three electrode pads 13 are short-circuited to each other inside the carrier 20 by an interconnect pattern 21*a* and a via 22*a*, and then connected via the carrier 20 to an external power-supply terminal VDD. Furthermore, electrode pads 13 (three electrode pads located in the right of the corner cell 11 in FIG. 8) that form the other of the inner pad arrays corresponding to the electrode-pad-disposition omission positions of FIG. 3 are individually bump-bonded to an interconnect pattern on the surface of the carrier 20. Those three electrode pads 13 are short-circuited to each other inside the carrier 20 by an interconnect pattern 21*b* and a via 22*b*, and then connected via the carrier 20 to an external ground terminal VSS. This allows the power supply of the semiconductor device to be fortified. For the other electrode pads 13, via generation for establishing connection with the carrier 20 is performed individually (illustration thereof is omitted.)

Figure 9:
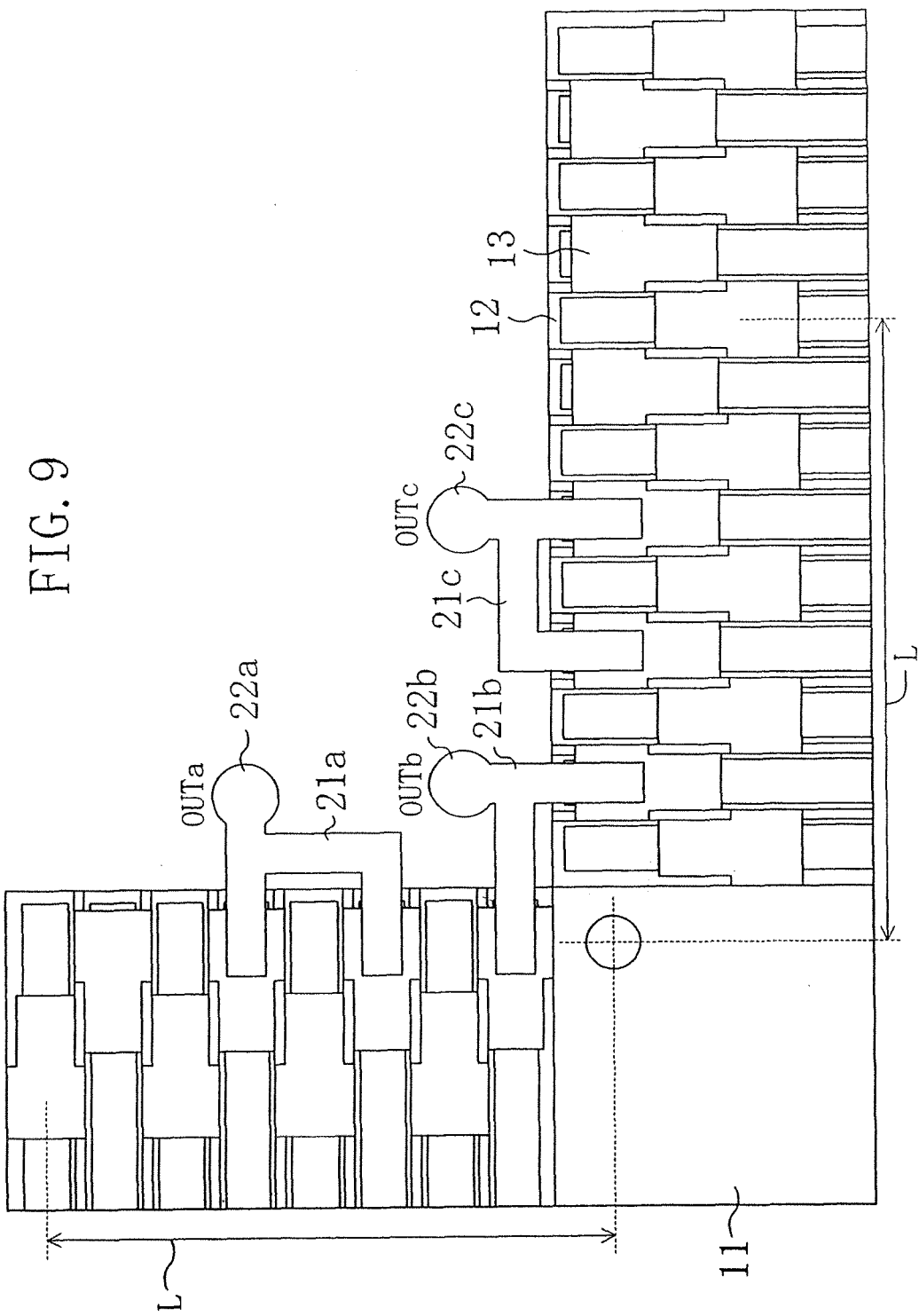
FIG. 9 is a plan view illustrating a sixth modified example of the electrode-pad arrangement of FIG. 3.

FIG. 9 illustrates a sixth modified example of the electrode-pad arrangement. In FIG. 9, electrode pads 13 (six electrode pads located in upper and right portions of the corner cell 11 in FIG. 9) that form the inner pad arrays corresponding to the electrode-pad-disposition omission positions of FIG. 3 are individually bump-bonded to an interconnect pattern on the surface of the carrier 20, while those six electrode pads 13 are classified into first through third groups, each including two electrode pads. The two electrode pads 13 of the first group are short-circuited to each other inside the carrier 20 by an interconnect pattern 21*a* and a via 22*a*, and then connected via the carrier 20 to a first external output terminal OUTa. The two electrode pads 13 of the second group are also short-circuited to each other inside the carrier 20 by an interconnect pattern 21*b* and a via 22*b*, and then connected via the carrier 20 to a second external output terminal OUTb. Moreover, the two electrode pads 13 of the third group are short-circuited to each other inside the carrier 20 by an interconnect pattern 21*c* and a via 22*c*, and then connected via the carrier 20 to a third external output terminal OUTc. As a result, the input/output cells 12 that correspond to the electrode pads 13 that are short-circuited to each other inside the carrier 20 each function as a single high-drive-current capability cell and as a single low-impedance cell. In other words, in the example of FIG. 9, the high-drive-current capability cells and the low-impedance cells can be created equivalently. For the other electrode pads 13, via generation for establishing connection with the carrier 20 is performed individually (illustration thereof is omitted.)

It should be noted that the short circuit of the electrode pads 13 performed inside the carrier 20 in the examples of FIGS. 8 and 9 may be realized by using the interconnect of any layer in the multilayer interconnect in the carrier 20.

What is claimed is:

1. A semiconductor device including a semiconductor chip, wherein:

the semiconductor chip includes:

a corner region on the semiconductor chip;

a first region on a peripheral region of the semiconductor chip;

a second region between the corner region and the first region;

a plurality of I/O cells including circuit elements disposed in the first region;

a plurality of electrode pads each overlapping a corresponding I/O cell of the plurality of I/O cells; and at least one other type of function cell disposed in the second region, wherein the plurality of electrode pads are configured in a zigzag pad arrangement, and the at least one other type of function cell has no corresponding electrode pad.

2. The semiconductor device of claim 1, wherein a longitudinal central line of each of the plurality of I/O cells overlaps a longitudinal central line of a corresponding electrode pad of the plurality of electrode pads.

3. The semiconductor device of claim 1, wherein an interval between each of the plurality of I/O cells is shorter than an interval between the at least one other type of function cell and an I/O cell of the plurality of I/O cells adjacent to the at least one other type of function cell.

4. The semiconductor device of claim 1, wherein the at least one other type of function cell is an ESD protection cell.

5. The semiconductor device of claim 1, wherein the at least one other type of function cell is an isolation cell.

6. The semiconductor device of claim 1, wherein the semiconductor chip further includes:

a pad-disposition restriction area in which no electrode pad is disposed, the pad-disposition restriction area being arranged between the corner region and the first region wherein the at least one other type of function cell having no corresponding electrode pad is disposed in the pad-disposition restriction area.

7. The semiconductor device of claim 1, wherein the plurality of I/O cells includes at least two first I/O cells each having an inner electrode pad as the corresponding electrode pad and at least two second I/O cells each having an outer electrode pad as the corresponding electrode pad, and the corresponding electrode pads of the at least two first and second I/O cells are configured in the zigzag pad arrangement so as to form inner and outer pad arrays.

8. The semiconductor device of claim 1, wherein no electrode pad overlaps the at least one other type of function cell in plan view.

9. The semiconductor device of claim 6, wherein no electrode pad overlaps the at least one other type of function cell in plan view.

* * * * *